(12) United States Patent
Tong et al.

(10) Patent No.: US 10,068,645 B2
(45) Date of Patent: Sep. 4, 2018

(54) MULTIPLE CYCLE SEARCH CONTENT ADDRESSABLE MEMORY

(71) Applicant: QUALCOMM Incorporated, San Diego, CA (US)

(72) Inventors: Kim Yaw Tong, Austin, TX (US); Suresh Kumar Venkumahanti, Austin, TX (US); Fadi Hamdan, Austin, TX (US); Kun Ma, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/369,823

(22) Filed: Dec. 5, 2016

(65) Prior Publication Data

US 2017/0345500 A1 Nov. 30, 2017

Related U.S. Application Data

(60) Provisional application No. 62/343,671, filed on May 31, 2016.

(51) Int. Cl.
*G11C 15/04* (2006.01)
(52) U.S. Cl.
CPC .................................... *G11C 15/04* (2013.01)
(58) Field of Classification Search
CPC .................................................... G11C 15/04
See application file for complete search history.

(56) References Cited

U.S. PATENT DOCUMENTS

| 5,758,148 | A | | 5/1998 | Lipovski | |
|---|---|---|---|---|---|
| 5,828,593 | A | * | 10/1998 | Schultz | G06F 17/30982 365/189.07 |
| 6,166,938 | A | * | 12/2000 | Wong | G11C 15/046 365/185.08 |
| 6,389,507 | B1 | | 5/2002 | Sherman | |
| 6,615,210 | B1 | * | 9/2003 | Huang | G06F 7/02 |
| 6,845,024 | B1 | * | 1/2005 | Wanzakhade | G11C 15/00 365/189.02 |
| 6,934,796 | B1 | * | 8/2005 | Pereira | G11C 15/00 365/49.17 |

(Continued)

OTHER PUBLICATIONS

International Search Report and Written Opinion—PCT/US2017/027110—ISA/EPO—datd Jul. 17, 2017.

*Primary Examiner* — Khamdan Alrobaie
(74) *Attorney, Agent, or Firm* — Arent Fox, LLP and Qualcomm, Incorporated (57) ABSTRACT

In an aspect of the disclosure, a method and an apparatus are provided. The apparatus may be a content addressable memory. The content addressable memory includes a plurality of memory sections each configured to store data. Additionally, the content addressable memory includes a comparator configured to compare the stored data in each of the plurality of memory sections with search input data. The comparison may be in a time division multiplexed fashion. The comparator may be configured to compare the stored data in each of the plurality of memory sections with search input data in a corresponding one of a plurality of memory access cycles. The content addressable memory may include a state machine configured to control when the comparator compares the stored data in each of the plurality of memory sections with search input data based on a state of the state machine.

24 Claims, 8 Drawing Sheets

(56) References Cited

U.S. PATENT DOCUMENTS

| | | | |
|---|---|---|---|
| 6,988,164 B1* | 1/2006 | Wanzakhade | G11C 15/00 |
| | | | 365/49.17 |
| 7,099,170 B1 | 8/2006 | Narum et al. | |
| 7,206,212 B1 | 4/2007 | Chou | |
| 7,586,772 B2* | 9/2009 | Chai | G11C 15/04 |
| | | | 365/189.07 |
| 7,894,227 B2 | 2/2011 | Inoue | |
| 8,031,503 B1 | 10/2011 | Gyllenhammer et al. | |
| 9,269,440 B2 | 2/2016 | Arsovski | |
| 2003/0223259 A1 | 12/2003 | Roth | |
| 2004/0125630 A1* | 7/2004 | Regev | G11C 15/00 |
| | | | 365/49.17 |
| 2005/0010719 A1* | 1/2005 | Slavin | G11C 15/00 |
| | | | 711/108 |
| 2005/0027931 A1* | 2/2005 | Joshi | G11C 15/00 |
| | | | 711/108 |
| 2006/0143375 A1 | 6/2006 | Pudipeddi | |
| 2008/0080223 A1* | 4/2008 | Arsovski | G11C 7/02 |
| | | | 365/49.1 |
| 2015/0006808 A1* | 1/2015 | Miller | G06F 17/30982 |
| | | | 711/108 |

* cited by examiner

MULTIPLE CYCLE SEARCH CONTENT ADDRESSABLE MEMORY

CROSS-REFERENCE TO RELATED APPLICATION(S)

This application claims the benefit of U.S. Provisional Application Ser. No. 62/343,671, entitled "Multiple Cycle Search Content Addressable Memory" and filed on May 31, 2016, which is expressly incorporated by reference herein in its entirety.

BACKGROUND

Field

The present disclosure relates generally to content addressable memory (CAM) circuitry, and more particularly, to a multiple cycle CAM.

Background

A CAM is a memory that may be addressable based on content. In other words, the CAM is addressable based on data that is stored in the CAM. Unlike random access memory (RAM) in which the user supplies a memory address and the RAM returns the data stored at that address, a CAM is designed such that the user supplies a data word and the CAM searches the memory to see if that data word is stored anywhere in the memory of the CAM. If the data word is found in the memory of the CAM, the CAM returns a list of one or more storage addresses where the word was found.

To perform a search, a CAM may include comparison circuits. Comparison circuitry in the CAM may compare input search data against stored data (or may compare input search data against a table containing a subset of the stored data). The comparison circuits may detect a match between a stored bit in a cell and an input bit.

The CAM returns the address of any matching data. The CAMs may be large memory arrays that consume significant silicon area on integrated circuits (ICs). In addition, high activity during CAM searches may factor into high power usage for CAMs and high power density in CAMs, e.g., high power usage in a small silicon die area.

CAM may be used in certain high-speed searching applications. CAM may also be referred to as associative memory or associative storage. CAM may compare input search data, sometimes referred to as a tag, against a table of stored data. The CAM may return the address of matching data.

A CAM is designed to search the CAM's entire memory in a single operation. Accordingly, a search for data in a CAM may be much faster than a similar search for data in a RAM. The amount of power used by a CAM may be significant. Accordingly, a system and method for reducing power usage of a content addressable memory may be desirable.

SUMMARY

The following presents a simplified summary of one or more aspects in order to provide a basic understanding of such aspects. The summary is not an extensive overview of all contemplated aspects and is intended to neither identify key or critical elements of all aspects nor delineate the scope of any or all aspects. The summary's sole purpose is to present some concepts of one or more aspects in a simplified form as a prelude to the more detailed description that is presented later.

In an aspect of the disclosure, a method and an apparatus are provided. The apparatus may be a content addressable memory (CAM). The CAM includes a plurality of memory sections each configured to store data. Additionally, the CAM includes a comparator configured to compare the stored data in each of the plurality of memory sections with search input data. The compare may be in a time division multiplexed fashion.

In another aspect of the disclosure, a CAM may include a plurality of memory sections each configured to store data. The CAM may also include a comparator configured to compare the stored data in each of the plurality of memory sections with search input data in a corresponding one of a plurality of memory access cycles.

In another aspect of the disclosure, a CAM may include a plurality of memory sections. Each of the plurality of memory sections may be configured to store data. The CAM may also include a comparator. Additionally, the CAM may include a state machine configured to control when the comparator compares the stored data in each of the plurality of memory sections with search input data based on a state of the state machine.

In another aspect of the disclosure, a method is provided. The method may be in a CAM. Additionally, the method may include storing data in a plurality of memory sections in the CAM. The method may also include comparing the stored data in each of the plurality of memory sections with search input data in a time division multiplexed fashion.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and several details are capable of modification in various other respects. Accordingly, the drawings and detailed description are to be regarded as illustrative in nature and not as restrictive

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. Acronyms and other descriptive terminology may be used merely for convenience and clarity and are not intended to limit any concept disclosed herein.

Various memories presented throughout this disclosure may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of the elements. Rather, the designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Various aspects of CAM will now be presented. The CAM may include one or more static random access memories (SRAMs). SRAM is volatile memory that requires power to retain data. Additionally, as those skilled in the art will readily appreciate, the CAM may include other types of memories and/or circuit configurations. Examples of other types of memories include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable type of memory. Accordingly, all references to a SRAM are intended only to illustrate exemplary aspects of memory with the understanding that such aspects may be extended to a wide range of applications.

Figure 1A:
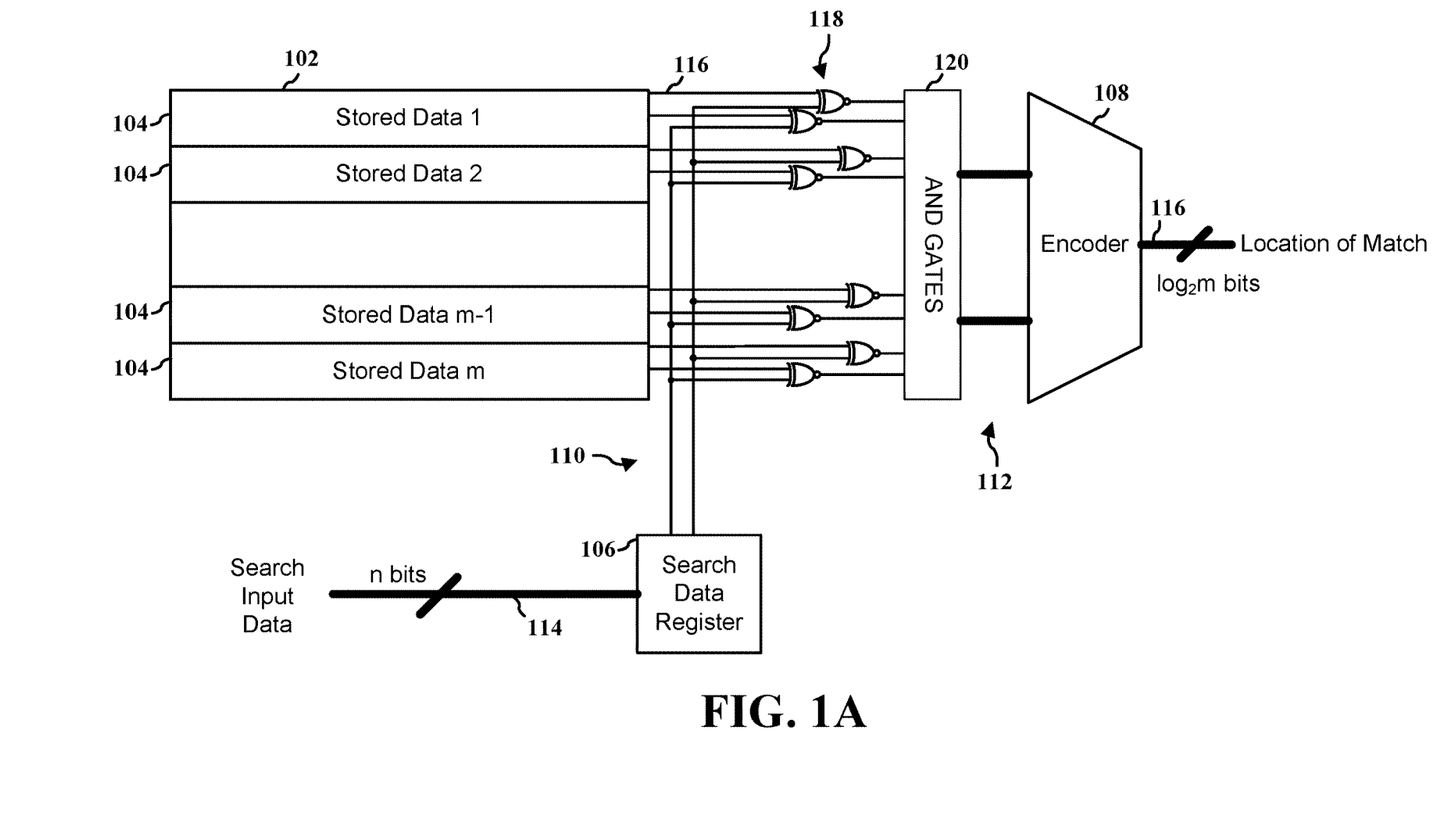
FIG. 1A is a conceptual block diagram illustrating an example CAM.

FIG. 1A is a conceptual block diagram illustrating an example CAM 100. The CAM 100 may be a memory that compares input search data (e.g., a tag) against a table of stored data. The CAM 100 may return the address(es) of matching data. The CAM 100 includes memory 102. The memory 102 may be one or more of various memory types described herein, e.g., SRAM. The memory 102 includes a plurality of memory storage spaces 104. Each of the memory storage spaces 104 may store a set of data, e.g., a word or words. In the illustrated example of FIG. 1A there are m sets of data stored. The sets of data may be, for example words. Accordingly, in one example the memory 102 may store m words of data.

The CAM 100 may also include a search data register 106 and an encoder 108. The search data register 106 outputs one or more, and generally a plurality, of search lines 110 based on the search input data 114. A series of match lines 112 are generated based on comparisons between the search input data as output on the search lines 110 and the data stored in the memory 102.

The example of FIG. 1A illustrates a simplified CAM in that each memory storage space 104 stores 2 bits. CAMs storing more bits per memory storage space are also possible. Because the memory storage space 104 of the example CAM 100 of FIG. 1A stores 2 bits, the CAM may search for 2 bits at a time, i.e., n=2. Thus, the search input data 114 in the example CAM 100 is 2 bits wide. Furthermore, the CAM 100 may search all m memory storage space 104 of the example CAM 100 of FIG. 1A at the same time. For example, the search input data 114 may be stored in the search data register 106. Outputs (e.g., 2 bits) from the search data register 106 may be compared to data output 116 from the memory storage spaces 104 using exclusive NOR gates 118. In the illustrated example, two exclusive NOR gates 118 may be used for each memory storage space 104, one for each of the n bits stored. Accordingly, there may be n match lines for each memory storage space 104.

Thus, data may be stored in the memory 102 and the search lines 110 may be compared using a series of exclusive NOR gates 118. One compare may be made for each bit in each memory storage space 104. In the example of FIG. 1A, the memory 102 stores a series of 2 bit words in each memory storage space 104, i.e., n=2. The example memory storage space 104 stores two bits. Two bit words may be compared to the 2 bits of search input data (n=2).

In the example of FIG. 1A, n=2, however, n may be any integer. Additionally, n may be larger than 2, e.g., 8, 16, 32, 64, 128, 256 bits, to name a few examples. The results of the comparisons may be input to AND gates 120. The AND gates may be used to combine the results of the comparisons performed by the XNOR gates 118 such that a stored word is considered a match if and only if all bits in the stored word match all bits in the input search term. Accordingly, the AND gates 120 may include a series of AND gates in the compare tree logic, e.g., the XNOR gates 118.

The outputs of the AND gates may be input into the encoder 108. The encoder 108 may generate a location match based on outputs 116 of the memory storage space 104. The location match may be based on results of compares performed using exclusive NOR gates 118 and output on the match lines 112. In an example a single location match, such as a first address match, may be provided. The address may be an address having $\log_2 m$ bits. The example $\log_2 m$ bits provides enough bits to address each of the m memory storage spaces. In other examples, multiple location matches may be output from an encoder. For example, multiple addresses $\log_2 m$ bits wide may be provided. The multiple addresses may be provided in parallel using additional sets of $\log_2 m$ bits outputs or provided one at a time using the $\log_2 m$ bits outputs. Another way to output the matching address(es) is to use an onehot(multi-hot) m-bit bus. The example CAM 100 includes m-words of 2 bit each. Other examples may include more or fewer bits, e.g., m-words of 4 bit each.

Figure 1B:
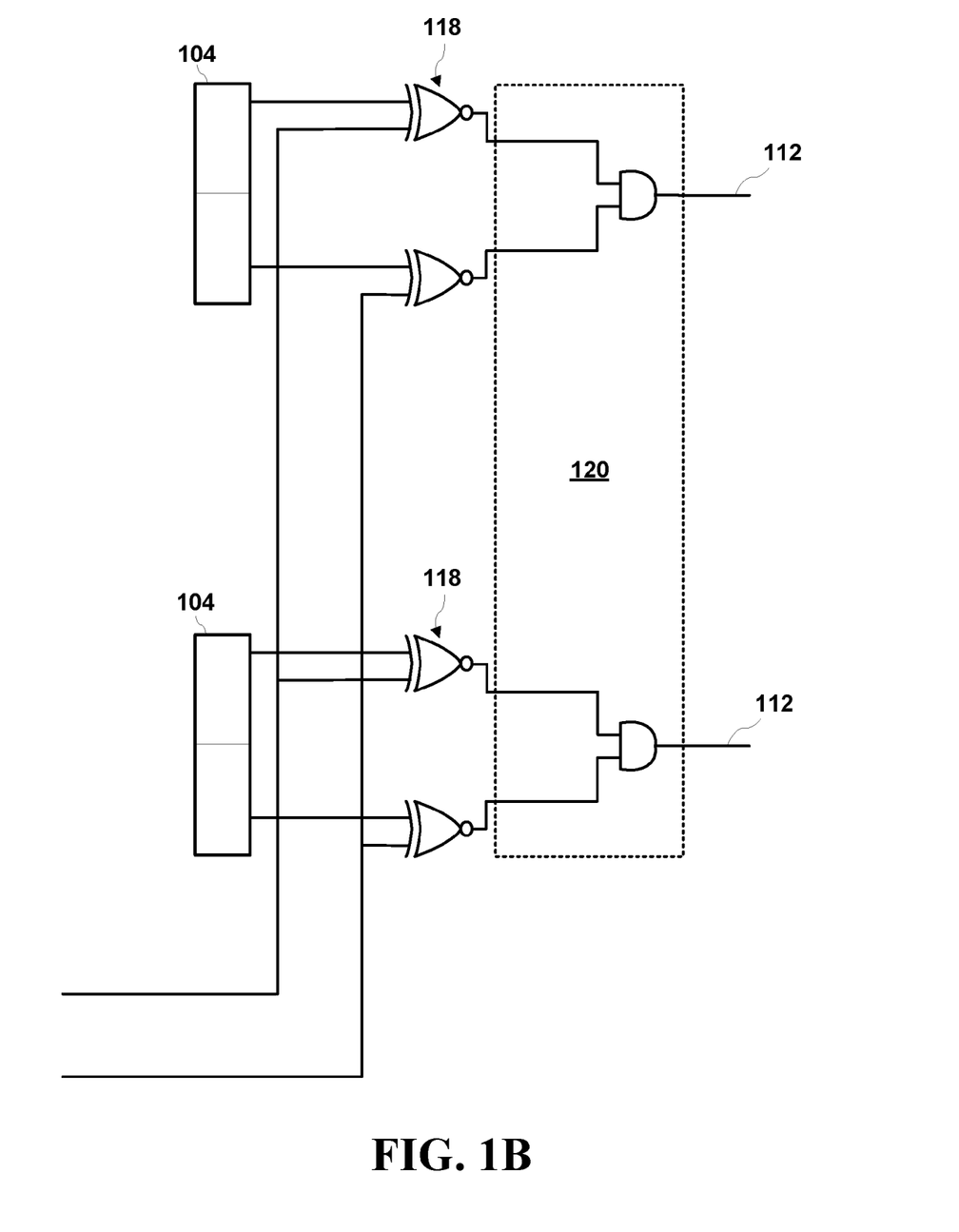
FIG. 1B is a conceptual block diagram illustrating a portion of the example CAM of FIG. 1A.

FIG. 1B is a conceptual block diagram illustrating a portion of the example CAM 100 of FIG. 1A. In a conventional m-words CAM, the number of compare trees needed and the number of match lines will be equal to m. The AND gates 120 may be configured to ensure that a stored word is considered a match if and only if all bits in the stored word match all bits in the input search term. The number of bits determines how many XNOR 118 and AND gates 120 needed in each compare tree.

Each of the bits may be compared using one of the XNOR gates 118. The AND gates 120 may be used to combine the results of the comparisons, e.g., the outputs of the XNOR gates 118, to generate the match lines 112. The series of AND gates 120 are configured such that a stored word is considered a match if and only if all bits in the stored word match all bits in the input search term. The AND gates 120 may be one gate wide to combine the two comparisons needed for the 2 bits.

Figure 1C:
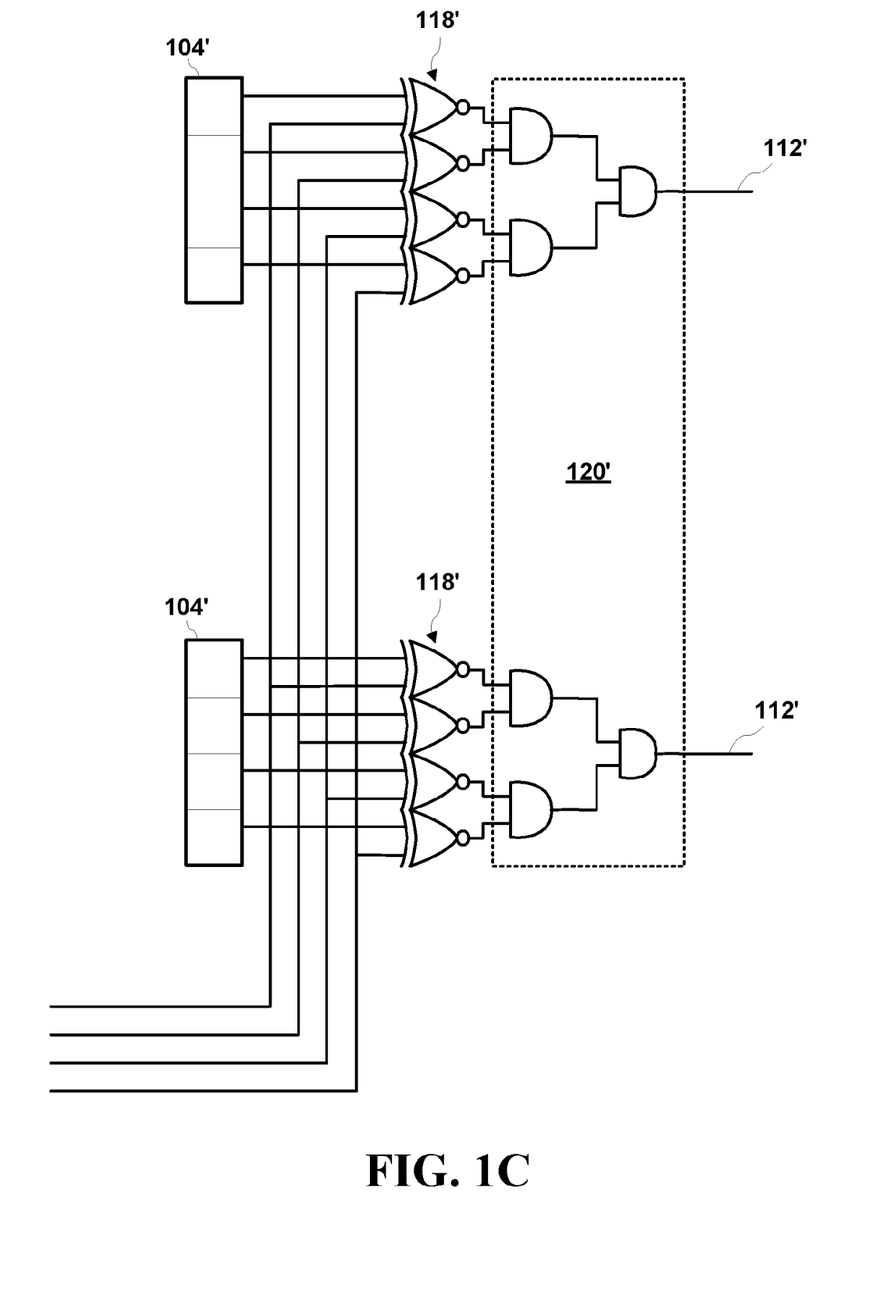
FIG. 1C is another conceptual block diagram illustrating a portion of an example CAM.

FIG. 1C is a conceptual block diagram illustrating a portion of an example CAM similar to FIG. 1B. The example of FIG. 1C may be used with a CAM that includes m-words of 4 bit each. (The example CAM 100 includes m-words of 2 bit each.) FIG. 1C illustrates memory storage space 104' capable of storing four bits each. Each of the bits may be compared using one of the XNOR gates 118'. The AND gates 120' may be used to combine the results of the comparisons, e.g., the outputs of the XNOR gates 118', to generate the match lines 112'. The series of AND gates 120' are configured such that a stored word is considered a match if and only if all bits in the stored word match all bits in the input search term. The AND gates 120' may be two gates wide to combine the four comparisons needed for the 4 bits.

Figure 2:
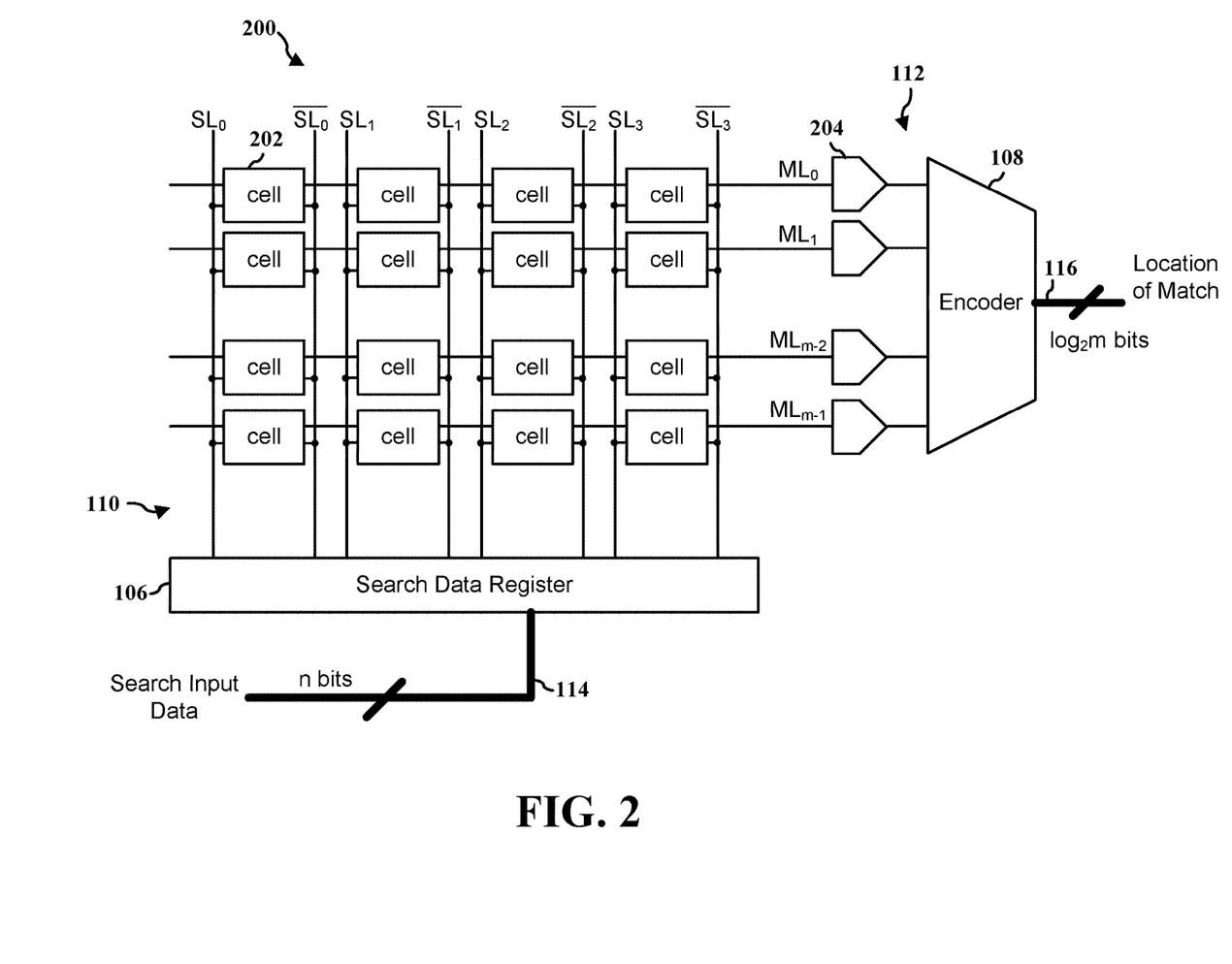
FIG. 2 is a conceptual block diagram illustrating the example CAM including a series of memory cells in the CAM.

FIG. 2 is a conceptual block diagram illustrating the example CAM 200. The example CAM 200 illustrated in FIG. 2 includes a plurality of memory cells 202 in the CAM 200. The memory cells 202 may each be circuitry that stores data. In one example, each memory cell 202 may store one bit of data. Accordingly, data may be written to and read from the memory cells 202.

The CAM 200 further includes a series of sense amplifiers 204. The sense amplifiers 204 may be used to amplify an output from a set of the memory cells 202. For example, a set of the memory cells 202 in the CAM 200 may be compared to generate a signal that indicates if a match has occurred or a match has not occurred, e.g., high for a match and low when a match has not occurred. Each memory cell 202 in a row may be attached to a match line, e.g., ML0, ML1, ML2, . . . MLm−1. A match line may be pre-charged high. Each cell may be capable of pulling the match line low if a bit stored in that memory cell does not match. Accordingly, in an example, a high logic value may indicate that a match has occurred and a low logic value may indicate that a match has not occurred. It will be understood, however, that in other examples, a high logic value may indicate that a match has not occurred and a low logic value may indicate that that a match has occurred.

FIG. 2 also illustrates differential search lines, e.g., $SL_0$ to $SL_3$ and $/SL_0$ to $/SL_3$. Comparison circuitry attached to the memory cell 202 may perform a comparison between the data on the search lines (SL and/SL) and the data in the memory cell 202 with an exclusive NOR operation. In an example, when data does not match in a memory cell 202, the data mismatch may pull a match line, e.g., $ML_0$ to $ML_{m-1}$, to ground, e.g., a logic low (or other state indicting a mismatch). When a match occurs, none of the memory cells on a match line may pull the match line to ground and the match line may be a logic high (or other state indicting a match). Each match line ($ML_0$ to $ML_{m-1}$) may be connected to multiple memory cells 202. For example, all memory cells 202 in a row. Any memory cell 202 may, e.g., when searched using the differential search lines (SL, /SL), control the state of the match line connected to the memory cell 202.

Figure 3:
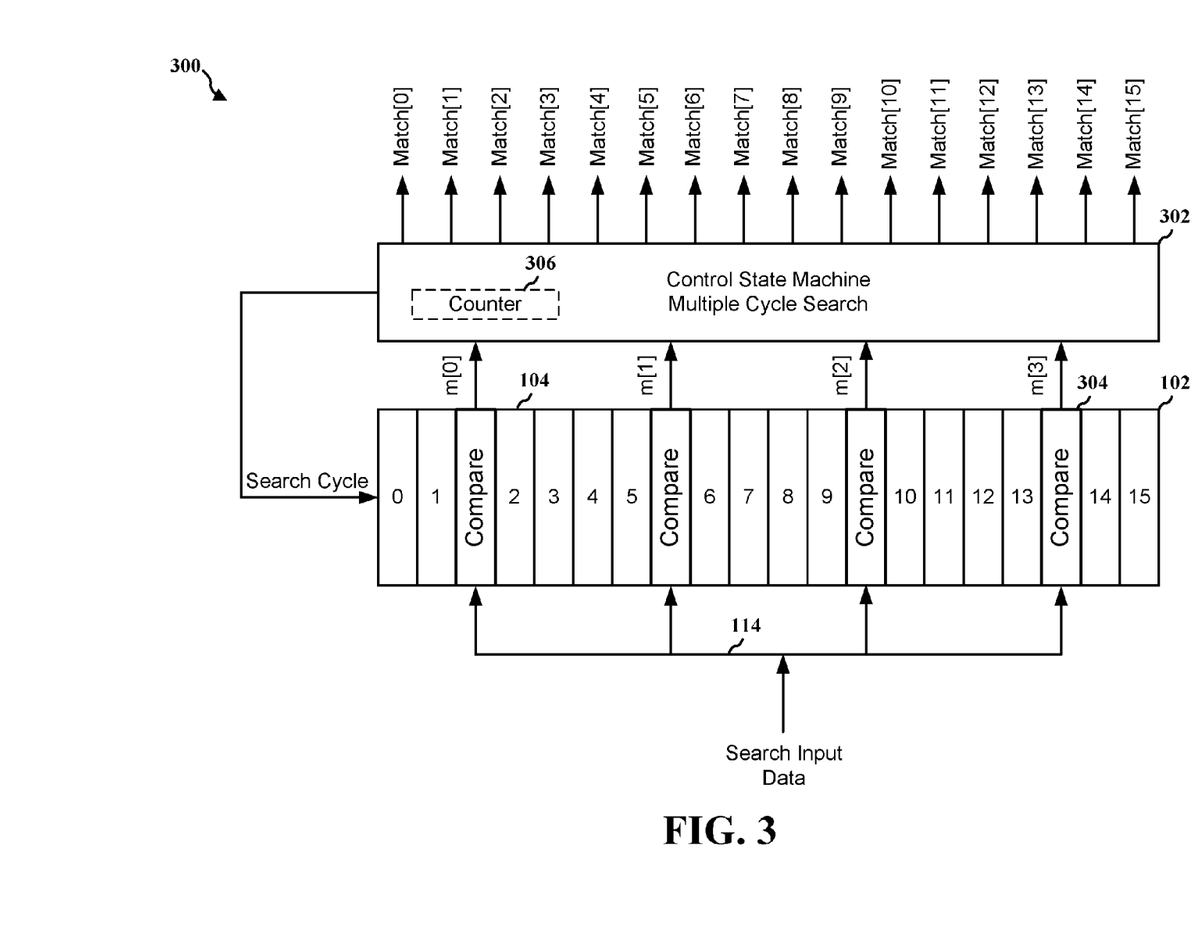
FIG. 3 is a conceptual diagram of a sixteen entry, 4-cycle search CAM.

FIG. 3 is a conceptual diagram of a sixteen entry, 4-cycle search CAM 300 in accordance with the systems and methods described herein. The example 4-cycle search CAM 300 may search four memory storage spaces 104 at a time, rather than searching each memory storage space at the same time as discussed with respect to FIG. 1A. Searching memory storage spaces 104 over a period of time, rather than in parallel, at one time, may decrease the circuitry required to perform the search. The example of FIG. 3 may search a total of 16 memory storage spaces 104, four memory storage spaces 104 at a time. A control state machine 302 may control the searches, which may occur, four searches at a time, over four counts of a counter 306.

Example CAMs, such as CAM 300, relate to memory array designs, and more specifically to a CAM that performs the search operation over multiple clock cycles. For example, the CAM 300 may perform the search operation in a time division multiplexed fashion. In other words, the CAM 300 may spread the search operation of a CAM over multiple clock cycles, which can contribute to a reduction in physical area and power density. Specifically, performing a search operation of a CAM 300 in a time division multiplexed fashion may reduce the total circuitry needed, and hence, decrease the physical area of the CAM 300. In other words, the amount of area on a die taken up by circuitry of the CAM 300 may be decreased. The amount of area on a die taken up by circuitry of the CAM 300 may be decreased because, by performing a search operation in a time division multiplexed fashion, the number of compare circuits needed may be decreased. The number of compare circuits needed may be decreased when comparing in a time division multiplexed fashion because at least some circuitry may be reused. The memory 102 may be organized into rows and columns, e.g., as illustrated in FIG. 2. The columns may be time division multiplexed such that all cells in a column are output to an encoder. Unlike in FIG. 2, however, circuitry may be used to process the time division multiplexed results, as is discussed with respect to FIG. 4. Furthermore, using fewer circuits may decrease power used, which may decrease power density of the CAM 300. Accordingly, the CAM 300 may effectively trade low search latency for reduced physical area and reduced power density.

A search operation of the CAM 300 may be performed over multiple clock cycles. When performing a search operation in the CAM 300 over multiple clock cycles, a subset of the memory entries are compared against the input search data in each clock cycle. Accordingly, CAM compare circuitry may be shared among multiple entries. As discussed above, sharing the CAM compare circuitry among multiple entries may reduce physical area and reduce power density. In some examples, a state machine 302 may be used to control the CAM search cycles.

In an example, when a search is initiated, the state machine 302 starts counting the search cycles. In the example, during each search cycle, a portion of the memory 102 is compared to the search input data 114. For example, during search cycle 1, the contents of entries 0, 4, 8, and 12 are sent, via multiplexors, to the shared compare circuitry. The 4 bit partial hit vector, m[3:0], may then be sent to the state machine 302 where the partial hit vectors may be collected. In the example, the state machine 302 may then increment the search cycle, e.g., the count of the counter 306. The incrementing of the counter 306 may cause a subsequent portion of the CAM 300 to be compared. In the example, the search may be complete after four (4) clock cycles when every entry in the memory array has been compared to the input search data and a hit vector, match [15:0], is produced.

In an example, the counter 306 may be a 2 bit counter. The 2 bit counter may begin at a binary count of "00." At the binary count of 00, the memory storage spaces 104 numbered 0, 4, 8, and 12 (or other group of four memory storage spaces 104) may be searched. The results of the search at count 00 may be stored within the control state machine 302. At the binary count of 01, the memory storage spaces 104 numbered 1, 5, 9, and 13 (or other group of four memory storage spaces 104) may be searched. The results of the search at count 01 may be stored within the control state machine 302. At the binary count of 10, the memory storage spaces 104 numbered 2, 6, 10, and 14 (or other group of four memory storage spaces 104) may be searched. The results of the search at count 10 may be stored within the control state machine 302. At the binary count of 11, the memory storage spaces 104 numbered 3, 7, 11, and 15 (or other group of four memory storage spaces 104) may be searched. The results of the search at count 11 may be stored within the control state machine 302. The results of the four searches performed in a time division multiplexed fashion and may be output on a series of match lines, e.g., Match[0 . . . 15].

As illustrated in FIG. 3, the CAM 300 may include a plurality of memory storage spaces 104. Each memory storage space 104 may be configured to store data, e.g., 2 bits of data in one simplified example. It will be understood that more data may be stored. The example CAM 300 may also include a comparator 304 configured to compare the data stored in the memory storage spaces 104 with search input data 114. The data stored in the memory storage spaces 104 may be compared with search input data 114 in a time division multiplexed fashion. For example, the CAM 300 may spread the search operation of a CAM over multiple clock cycles.

The state machine 302 may be configured to control when the comparator 304 compares the data stored in memory storage spaces 104 with the search input data 114 based on a state of the state machine.

As mentioned above, the state machine 302 may include a counter 306. The state of the state machine 302 may correspond to a count of the counter 306. The comparator 304 compares the stored data in each of the memory storage spaces 104 with the search input data 114 based on the count of the counter 306. In an example, the counter may control which memory storage spaces are accessed and compared. For example, at a binary count, 00, memory storage spaces 0, 4, 8, and 12 may be compared. In another example, the counter may control multiplexor circuitry that controls which bits from the memory storage spaces 104 are output to compare circuitry such as exclusive NOR gates. The exclusive NOR gates may be used to compare the outputs of the multiplexor circuitry to the data being searched, as is discussed in more detail with respect to FIG. 4.

The comparator 304 may be further configured to compare the data stored in memory storage spaces 104 with the search input data 114 in a corresponding one of a plurality of memory access cycles 0-3 of FIG. 3. In an example, in CAM 300 each of the plurality of, for example, memory access cycles 0-3 of FIG. 3 access a subset of words in a set of memory storage spaces 104 of the CAM 300. For example, as discussed above, the counter 306 may be a 2 bit counter that may begin at a binary count of 00 and count through four states, e.g., 00, 01, 10, 11. At each of the binary counts, different sets of the memory storage spaces 104 may be searched. Thus, the results of the four searches performed in a time division multiplexed fashion and may be output on a series of match lines, e.g., Match[0 . . . 15].

In an example, the comparator 304 is further configured to compare the stored data (e.g., data stored in memory storage spaces 104) in each of the plurality of memory storage spaces 104 with the search input data 114 in a time division multiplexed fashion. For example, as discussed above, compares may be performed over a count through four states, e.g., 00, 01, 10, 11. At each of the binary counts, different sets of the memory storage spaces 104 may be searched. Other sized counters may be used for different combinations of a number of memory storage spaces 104 and number of memory storage spaces 104 searched per count. For example, sixteen memory storage spaces may be searched two at a time over eight counts. Sixteen memory storage spaces may be searched eight at a time over two counts. Sixty-four memory storage spaces may be searched four at a time over sixteen counts, to name a few examples. Other combinations are also possible.

In an example, the state machine 302 controls an encoder to cause the encoder to encode a result of a compare of the stored data (e.g., the data stored in memory storage spaces 104) in each of the plurality of memory storage spaces 104 with the search input data 114. For example, a column may be selected and each memory space in each row of the column compared to search input data. In another example, multiplexing between, e.g., two outputs of a two bit memory storage space 104, may be used. (Wider multiplexors may be used for larger memory storage spaces.) The states of the state machine may be a series of count values that control which bits are compared. For example, in an example that compares 16 bits over four counts, a two-bit counter may be used to count through the four cycles of compares.

In another example, the state machine 302 is configured to control a register to cause a register (e.g., in FIG. 4) to store at least one of the result of the compare of the stored data (e.g., the data stored in memory storage spaces 104) in each of the plurality of memory storage spaces 104 with the search input data 114 in a time division multiplexed fashion. For example, a register may store an output of an exclusive NOR gate. The output of the exclusive NOR gate may be input to the register when a compare of a bit in the memory 102 and a value to be searched in the CAM 300 is made using the exclusive NOR gate. For example, the state machine 302 may control when values to be compared, e.g., a value from a memory storage space 104 and a value to be compared, are provided at inputs to an exclusive NOR gate. The state machine 302 may also control when a value at an output of the exclusive NOR gate is input to the register.

Accordingly, a result (or results) of a compare (or compares) may be stored in a register (or registers).

In an example, the state machine 302 may include a counter 306. The state of the state machine may correspond to a count of the counter 306. Additionally, the comparator 304 may compare the stored data (e.g., the data stored in memory storage spaces 104) in each of the plurality of memory storage spaces 104 with the search input data 114 based on the count of the counter 306. For example, the state machine may cycle through each state, e.g., each count, 00, 01, 10, 11, and one or more of the memory spaces may be selected and compared to the search input data. Thus, the counter may cause the compares to occur in a time division multiplexed fashion.

In an example, the comparator 304 may be further configured to compare the stored data (e.g., the data stored in memory storage spaces 104) in each of the plurality of memory storage spaces 104 with the search input data 114 in a corresponding one of a plurality of memory access cycles 0-3.

In an example, each of the plurality of memory access cycles 0-3 access a subset of words in a set of memory storage spaces 104 of the CAM 300. Thus, while some examples, may compare sets of word at each count of a counter, e.g., words in memory storage spaces 0, 4, 8, and 12; 1, 5, 9, and 13; 2, 6, 10, and 14; or 3, 7, 11, and 15; other examples may compare subsets of words at each count of a counter. Examples comparing subsets of words at each count of a counter may use multiplexing to select between bits in a word in each memory storage space. The time division multiplexing may be controlled by the count of the counter 306.

As described above, the CAM 300 performs compares in a time division multiplexed fashion. Performing comparisons in a CAM 300 in a time division multiplexed fashion may reduce die area, reduce power consumption, reduce power density, or any combination of these as explained above. The reduction in die area, reduction in power consumption, reduction in power density, or any combination of these, may be achieved by using shared comparator circuitry. The shared circuitry may lead to less circuitry being used in an example CAM 300. Using less circuitry may reduce die area, reduce power consumption, reduce power density, or some combination of these.

Figure 4:
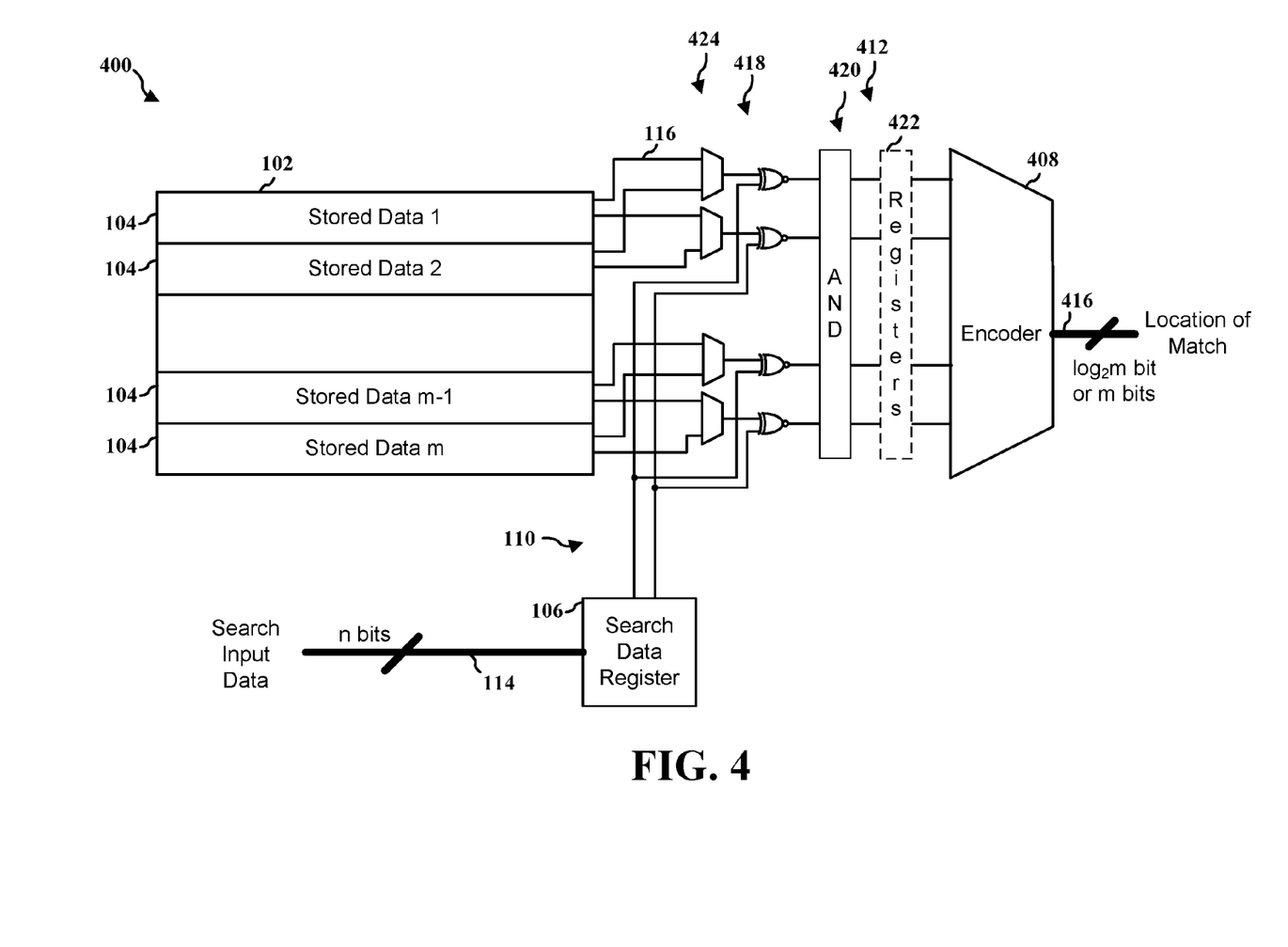
FIG. 4 is a conceptual block diagram illustrating an example CAM with shared compare circuitry.

FIG. 4 is a conceptual block diagram illustrating an example CAM 400 with shared compare circuitry in accordance with the systems and methods described herein. The CAM 400 includes memory 102. The memory 102 includes a series of memory storage spaces 104. The memory storage spaces 104 may store a number of sets of data. For example, each memory storage space 104 may store a word, e.g., a 2, 4, 8, 16, 32, 64, or other number of bit word. In the illustrated example of FIG. 4, there are m sets of data stored. The sets of data may be, for example words. Accordingly, in one example the memory 102 may store m words of data, with, e.g., one word in each memory storage space 104. The data stored in each memory storage space 104, is not limited to words. Any integer number of bits may be used. Two bit words are used as a simplified example to illustrate the concepts. These concepts may be extended to other numbers of bits.

The CAM 400 also includes a search data register 106 and an encoder 408. The search data register 106 outputs a series of search lines 110 based on the search input data 114. A series of match lines 412 are generated by AND gates 420. The AND gates may be configured to ensure that a stored word is considered a match if and only if all bits in the stored word match all bits in the input search term. The match lines may be based on comparisons between the search input data as output by the search data register on the search lines 110 and the data stored in the memory 102. The match lines are driven to logic levels based on the comparisons.

The data stored in the memory 102 and the search lines 110 may be compared using a series of exclusive NOR gates 418. One compare may be made for each bit stored in each memory storage space 104 to a bit of search input data 114 that may be stored in search data register 106. In an aspect, the compare circuitry may be shared. Accordingly, the compares may be performed in a time division multiplexed fashion. For example, the CAM 400 may perform a search operation over multiple clock cycles. The CAM 400 may spread the search operation of a CAM over multiple clock cycles. The CAM 400 may spread the search operation of a CAM over multiple clock cycles to achieve a reduction in physical area and power density. Performing a search operation of the CAM 400 in a time division multiplexed fashion may decrease the physical area of the CAM 400 and decrease power density of the CAM 400. Accordingly, the CAM 400 may effectively trade low search latency for reduced physical area and reduced power density of the CAM 400. For example, in the circuit illustrated in FIG. 4, the number of exclusive NOR gates 418 used to compare the CAM 400 may be reduced by one half as compared to a circuit that does not perform the search in a time division multiplexed fashion. Each of the two input multiplexors 424 may route one bit of a two bit word at a time to the one of the exclusive NOR gates 418. The exclusive NOR gates 418 may each compare a bit from the memory 102 to a bit from the search data register 106. After two sets of compares each bit in the memory 102 of the CAM 400 may be compared. Other combinations of memory storage space 104 size, multiplexor 424 size, exclusive NOR gate 418 size may be used to perform search operations of other CAMs in a time division multiplexed fashion.

By sharing the compare circuitry, fewer exclusive NOR gates 418 may be used because the circuitry may be shared by using the multiplexors 424. The compares may be performed in a time division multiplexed fashion. As described above, the multiplexors 424 may each select between two bits stored in memory storage locations 104. For example, as illustrated in FIG. 4, each NOR gate 418 may compare two outputs from the memory 102, e.g., each output from one of two memory storage spaces 104. For example, the compares may perform over multiple clock cycles, e.g., to perform a search of the Cam 400. Thus, the CAM 400 may spread the search operation of a CAM over multiple clock cycles. Performing a search operation of the CAM 400 in a time division multiplexed fashion may decrease the physical area of the CAM 400 because fewer gates, e.g., exclusive NOR gates 418 are needed.

The result of the comparisons may be input to the encoder 408. The encoder 408 may generate a location match 416 based on the match lines 412. The location match may be a memory address, e.g., a "location" within memory, where the data searched is stored. In some examples, a single address may be output when the data is found in the CAM 400. For example, the first location that includes that data searched using the search input data 114. In other examples, addresses may be output serially, in parallel, or some combination of these depending on the number of matches and the available outputs at the encoder 408. For example, the encoder 408 may generate an address for a memory location within the CAM 400 that contains data that matches the search input data 114 stored in the search data register 106 and searched by the CAM 400. In some examples, the encoder 408 of FIG. 4 may be smaller than the encoder 108 of FIG. 1A because sharing the compare circuitry (exclusive NOR gates 418) may allow for an encoder 408 having fewer inputs. An encoder 408 having fewer inputs may use fewer gates. Accordingly, the encoder 408 may be smaller, e.g., may take up less area on a die implementing the CAM 400 As discussed, in some examples, a single address (when a match occurs) may be output. In other examples, zero, one, or more addresses may be output serially, in parallel, or using some combination of serial and parallel outputs.

The example of FIG. 4 may use fewer compare gates, e.g., exclusive NOR gates 418. Thus, performing the search operation of the CAM 400 in a time division multiplexed fashion may also decrease the physical area of the CAM 400 because fewer gates may be needed.

In the example of FIG. 4, the memory 102 stores a series of 2 bit words in each memory storage space, i.e., n=2. As discussed above, with respect to FIG. 1A, n may be any integer. Additionally, n may be larger than 2, e.g., 8, 16, 32, 64, 128, 256 bits, to name a few examples. Powers of two are provided as examples, e.g., 8, 16, 32, 64, 128, 256 bits, because traditionally, many memories are sized as powers of $2^n$ bits or $2^n$ words. Powers of two may be used because a memory of $2^n$ words may address each word using n bits. Other numbers of bits may be stored in each memory storage space.

As described herein, the CAM 400 may include a plurality of memory storage spaces 104, each configured to store data. The example CAM 400 may also include exclusive NOR gates 418 configured to compare the stored data (e.g., data stored in memory storage spaces 104) in each of the plurality of memory storage spaces 104 of memory 102 with search input data 114 in a time division multiplexed fashion.

The CAM 400 may also include an encoder 408 configured to encode a result on the match lines 412. The result may be a result of a compare of the stored data (e.g., data stored in memory storage spaces 104) in each of the plurality of memory storage spaces 104 with the search input data 114.

Additionally, the CAM 400 may also include a register 422 configured to store at least one of the result of the compare of the stored data in each of the plurality of memory storage spaces 104 with the search input data 114 in a time division multiplexed fashion. The register 422 may be a plurality of registers configured to store the results of compares of the stored data (e.g., data stored in memory storage spaces 104) in each of the plurality of memory storage spaces 104 of memory 102 with search input data 114 in a time division multiplexed fashion (e.g., using exclusive NOR gate 418) may be combined, e.g., "ANDed," so that a single result for each set of compares (each individual compare for memory storage spaces 104 1 to m) or for all the compares (e.g., a combination of all compares 1 to m) may be achieved for the time division multiplexed compare.

The comparator, e.g., exclusive NOR gate 418, may be further configured to compare the stored data (e.g., data stored in memory storage spaces 104) in each of the plurality of memory storage spaces 104 with the search input data 114 in a corresponding one of a plurality of memory access cycles (e.g., memory access cycles 0-3 of FIG. 3). In an example, each of the plurality of memory access cycles (e.g., memory access cycles 0-3 of FIG. 3) access a subset of words in a set of memory storage spaces 104 of the CAM 400. The CAM 400 may include a plurality of memory storage spaces 104. The plurality of memory storage spaces 104 may each be configured to store data. The CAM 400 may also include a comparator, e.g., exclusive NOR gate 418, configured to compare the stored data (e.g., data stored in memory storage spaces 104) in each of the plurality of memory storage spaces 104 with search input data 114 in a corresponding one of a plurality of memory access cycles (e.g., memory access cycles 0-3 of FIG. 3).

The CAM 400 may also include an encoder 408. The encoder 408 may be configured to encode a result, e.g., on the match lines 412. The result may be a result of a compare of the stored data (e.g., data stored in memory storage spaces 104) in each of the plurality of memory storage spaces 104 with the search input data 114.

The CAM 400 may also include a register 422. The register 422 may be configured to store at least one of the result of the compare of the stored data in each of the plurality of memory storage spaces 104 with the search input data 114 in the time division multiplexed fashion.

The comparator, e.g., exclusive NOR gate 418, may be further configured to compare the stored data (e.g., data stored in memory storage spaces 104) in each of the plurality of memory storage spaces 104 with the search input data 114 in a time division multiplexed fashion.

In an example, each of the plurality of memory access cycles (e.g., memory access cycles 0-3 of FIG. 3) may access a subset of words in a set of memory storage spaces 104 of the CAM 400.

Another example CAM 400 may include a plurality of memory storage spaces 104. Each memory storage spaces 104 may be configured to store data. The CAM 400 may also include a comparator, e.g., exclusive NOR gate 418. The CAM 400 may also include a state machine (e.g., state machine 302 of FIG. 3) configured to control when the comparator, e.g., exclusive NOR gate 418, compares the stored data (e.g., data stored in memory storage spaces 104) in each of the plurality of memory storage spaces 104 with search input data 114 based on a state of the state machine 302.

In an example, the state machine 302 may further be configured to control an encoder 408 to cause the encoder 408 to encode a result (e.g., match lines 412) of a compare of the stored data (e.g., the data stored in memory storage spaces 104) in each of the plurality of memory storage spaces 104 with the search input data 114.

In an example, the state machine 302 may further be configured to control a register 422 to cause the register 422 to store at least one of the result on the match lines 412. The result may be a result of the compare of the stored data (e.g., the data stored in memory storage spaces 104) in each of the plurality of memory storage spaces 104 with the search input data 114 in a time division multiplexed fashion.

In an example, the comparator, e.g., exclusive NOR gate 418, may be further configured to compare the stored data (e.g., the data stored in memory storage spaces 104) in each of the plurality of memory storage spaces 104 with the search input data 114 in a time division multiplexed fashion.

In an example, the comparator, e.g., exclusive NOR gate 418, may be further configured to compare the stored data (e.g., the data stored in memory storage spaces 104) in each of the plurality of memory storage spaces 104 with the search input data 114 in a corresponding one of a plurality of memory access cycles (memory access cycles 0-3 in FIG. 3).

In an example, each of the plurality of memory access cycles (memory access cycles 0-3 in FIG. 3) access a subset of words in a set of memory storage spaces 104) of the CAM 400.

As described above, the CAM 400 performs compares in a time division multiplexed fashion. Performing compares in a CAM 400 in a time division multiplexed fashion may reduce die area, reduce power consumption, reduce power density, or any combination of these. The reduction in die area, reduction in power consumption, reduction in power density, or any combination of these, may be achieved by using shared comparator circuitry. The shared circuitry may lead to less circuitry being used in an example CAM 400. Using less circuitry may reduce die area, reduce power consumption, reduce power density, or some combination of these.

Figure 5:
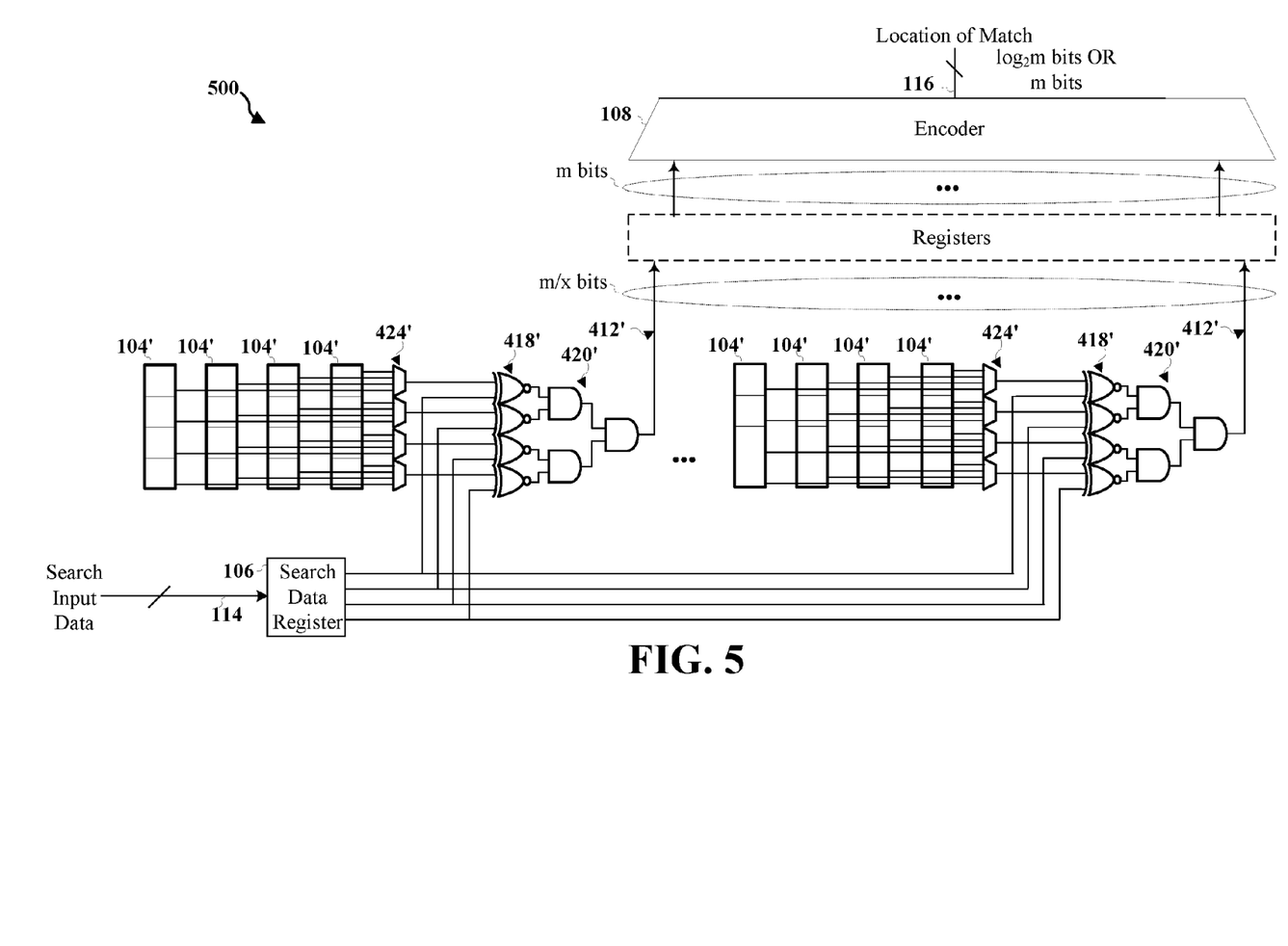
FIG. 5 is another conceptual block diagram illustrating an example CAM with shared compare circuitry.

FIG. 5 is another conceptual block diagram illustrating an example CAM 500 with shared compare circuitry. The conceptual block diagram illustrating the example CAM 500 with shared compare circuitry of FIG. 5 is generally similar to the conceptual block diagram illustrating the example CAM 400 with shared compare circuitry of FIG. 4. The CAM 400 includes m-words of 2 bit each, while the example CAM 500 includes m-words of 4 bit each. The memory storage space 104' in FIG. 5 is capable of storing four bits each. The four bits may be multiplexed using the multiplexors 424' so that each bit of the four bits may be compared to corresponding bits from other sets of four bits. Each of the bits may be compared using one of the XNOR gates 418'. The AND gates 420' may be used to combine the results of the comparisons, e.g., the outputs of the XNOR gates 418', to generate the match lines 412'. The series of AND gates 420' may be configured such that a stored word is considered a match if and only if all bits in the stored word match all bits in the input search term. The AND gates 420' may be two gates deep to combine the four comparisons needed for the 4 bits.

In a time division multiplexed CAM, the number of compare trees and the number of match lines may be equal to m/x where x is the number of cycles to search through the CAM. However, ultimately the output, after the output encoder, would be either an m-bit bus each bit representing one of the m words in the CAM, or log 2(m)-bit if the output is binary encoded.

Figure 6:
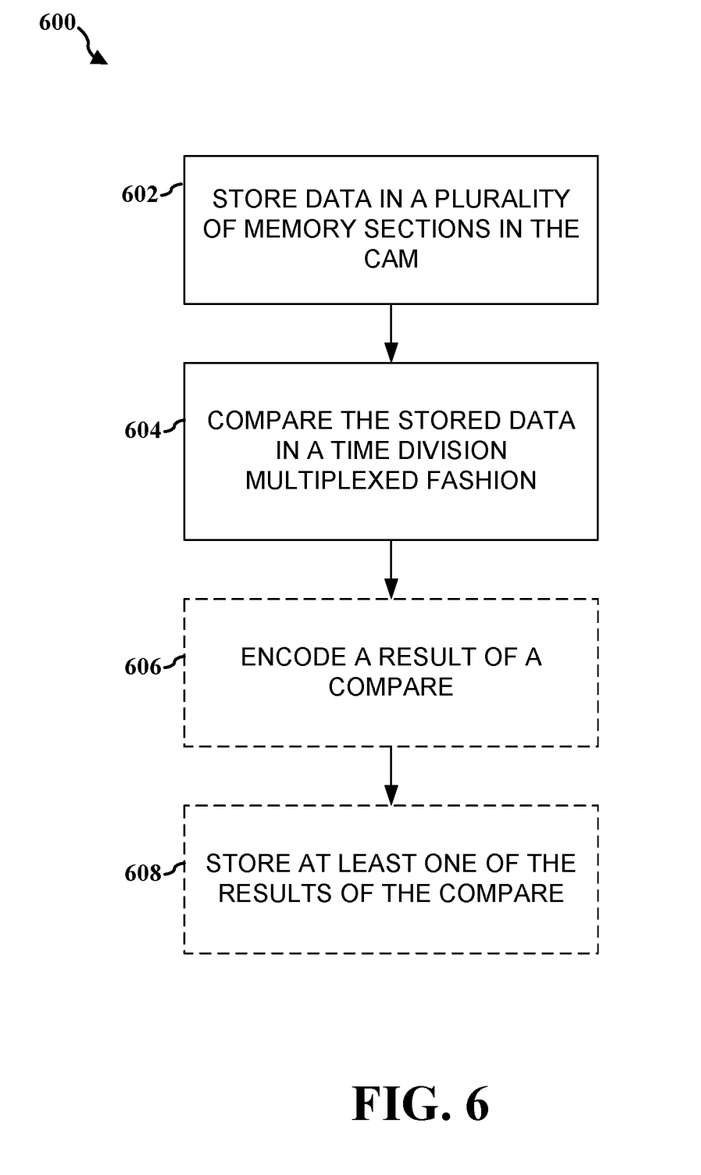
FIG. 6 is a flowchart illustrating an example method that may be implemented in a CAM.

FIG. 6 is a flowchart illustrating an example method that may be implemented in a CAM. In a block 602, a CAM implementing the method stores data in a plurality of memory sections in the CAM. For example, the CAM (300, 400) stores data in a plurality of memory storage sections (memory storage spaces 104) in the CAM (300, 400). The data may be stored, e.g., in an SRAM memory. Rather than the data from the memory being available to an output of the SRAM, the data may be output to compare circuitry within the CAM.

In a block 604, the CAM compares the stored data in each of the plurality of memory sections with search input data in a time division multiplexed fashion. For example, the CAM (300, 400) compares (304, e.g., using exclusive NOR gate 418, 418') the stored data in each of the plurality of memory sections (104) with search input data in a time division multiplexed fashion.

As discussed above with reference to FIG. 3, the CAM compares the stored data in each of the plurality of memory sections with search input data in a time division multiplexed fashion in a few different ways. For example, a counter 306 may be used to count through a series of states. At each state a subset of memory sections, e.g., memory storage spaces, may be compared. For example, for a CAM 300 with 16 memory storage spaces 104, a 2 bit counter may be used to count through four counts and compare 4 memory storage spaces 104 at a time to compare each of the 16 memory storage spaces 104, e.g., by comparing memory storage spaces 104 0, 4, 8, and 12; 1, 5, 9, and 13; 2, 6, 10, and 14; and 3, 7, 11, and 15. Another example may compare subsets of words within storage spaces 104. For example, a two input multiplexor may be used to alternately compare each bit of a two bit word in a storage space 104.

In a block 606, optionally, the CAM may encode a result of a compare of the stored data in each of the plurality of memory sections with the search input data. For example, the CAM (300, 400) may encode a result (e.g., on the match lines 412, 412') of a compare of the stored data in each of the plurality of memory sections with the search input data (114). For example, the match lines of a 16 memory storage space 104 CAM 300 may be mapped from 16 different single bit match outputs to one or more one or more four bit addresses. Some examples may output a single 4 bit address. Other examples may output each 4 bit address that includes a match. The 4 bit addresses may be output at the same time across a series of 4 bit outputs, one at a time using a single 4 bit output, or some combination of multiple 4 bit outputs used over time.

In a block 608, optionally, the CAM may store at least one of the results of the compare of the stored data in each of the plurality of memory sections with the search input data in the time division multiplexed fashion. For example, the CAM may store at least one of the results (e.g., on the match lines 412, 412') of the compare of the stored data in each of the plurality of memory sections (104) with the search input data (114) in the time division multiplexed fashion. For example, results may be stored in one or more registers 422 so that the results of all comparisons performed in a time division multiplexed fashion may be provided to the encoder 408.

A CAM (300, 400) may include means for storing data in a plurality of memory sections (104) in the CAM (300, 400), such as the memory 102, including memory storage spaces 104. In some examples, the memory storage spaces 104 may be SRAM or other types of data storage. The CAM (300, 400) may also include means for comparing (304, 418, 418') the stored data in each of the plurality of memory sections (104) with search input data in a time division multiplexed fashion. The means for comparing (304, 418, 418') the stored data in each of the plurality of memory sections (104) with search input data in a time division multiplexed fashion may include exclusive NOR gates 418, 418', multiplexors 424, 424', counter 306, and other circuitry configured to compare the plurality of memory sections (104) with search input data in a time division multiplexed fashion.

Additionally, in an example, the CAM may include means for encoding a result of a compare of the stored data in each of the plurality of memory sections with the search input data. For example, the CAM (300, 400) may include means for encoding a result (e.g., match lines 412, 412') of a compare of the stored data in each of the plurality of memory sections with the search input data (114), e.g., the encoder (408). In another example, the CAM (300, 400) may include means for storing at least one of the results (412, 412') of the compare of the stored data in each of the plurality of memory sections (104) with the search input data (114) in the time division multiplexed fashion, such as the register (422).

One example CAM (300, 400) may include a plurality of memory sections (e.g., memory storage spaces 104) each configured to store data. The example CAM (400) may also include a comparator (e.g., exclusive NOR gate 418, 418', and multiplexor 424, 424') configured to compare the stored data (e.g., data stored in memory storage spaces 104) in each of the plurality of memory sections (e.g., memory storage spaces 104 of memory 102) with search input data (114) in a time division multiplexed fashion (e.g., using exclusive NOR gate 418, 418' and multiplexor 424, 424').

An example CAM (300, 400) may also include an encoder (408) configured to encode a result (e.g., match lines 412, 412') of a compare of the stored data (e.g., data stored in memory storage spaces 104) in each of the plurality of memory sections (e.g., memory storage spaces 104) with the search input data (114).

An example CAM (400) may also include a register (422) configured to store at least one of the result of the compare of the stored data in each of the plurality of memory sections (e.g., memory storage spaces 104) with the search input data (114) in the time division multiplexed fashion. The register (422) may be a plurality of registers configured to store the results of compares of the stored data (e.g., data stored in memory storage spaces 104) in each of the plurality of memory sections (e.g., memory storage spaces 104 of memory 102) with search input data (114) in a time division multiplexed fashion (e.g., using exclusive NOR gate 418, 418', and multiplexor 424, 424') may be combined, e.g., "ANDed," so that a single result for each set of compares (each individual compare for memory storage spaces 104 1 to m) or for all the compares (e.g., a combination of all compares 1 to m) may be achieved for the time division multiplexed compare.

An example CAM (300, 400) may also include a state machine (302) configured to control when the comparator (304, 418, 418') compares the stored data (e.g., data stored in memory storage spaces 104) in each of the plurality of memory sections (e.g., memory storage spaces 104) with the search input data (114) based on a state of the state machine.

In an example, CAM (300, 400) the state machine (302) may include a counter (306). The state of the state machine (302) may correspond to a count of the counter (306). The comparator (304, 418, 418') compares the stored data in each of the plurality of memory sections (e.g., memory storage spaces 104) with the search input data (114) based on the count of the counter (306).

In an example, CAM (300, 400) the comparator (304, 418, 418') is further configured to compare the stored data (e.g., data stored in memory storage spaces 104) in each of the plurality of memory sections (memory storage spaces 104) with the search input data (114) in a corresponding one of a plurality of memory access cycles (e.g., memory access cycles 0-3 of FIG. 3).

In an example, CAM (300, 400) each of the plurality of memory access cycles (e.g., memory access cycles 0-3 of FIG. 3) access a subset of words in a set of memory locations (memory storage spaces 104) of the CAM (300, 400).

An example CAM (300, 400) may include a plurality of memory sections (e.g., memory storage spaces 104). The plurality of memory sections (e.g., memory storage spaces 104) may each be configured to store data. The example CAM (300, 400) may also include a comparator (304, 418, 418') configured to compare the stored data (e.g., data stored in memory storage spaces 104) in each of the plurality of memory sections (e.g., memory storage spaces 104) with search input data (114) in a corresponding one of a plurality of memory access cycles (e.g., memory access cycles 0-3 of FIG. 3).

Another example CAM (300, 400) may also include an encoder (408) configured to encode a result (e.g., match lines 412, 412') of a compare of the stored data (e.g., data stored in memory storage spaces 104) in each of the plurality of memory sections (e.g., memory storage spaces 104) with the search input data (114).

An example CAM (300, 400) may also include a register (422) configured to store at least one of the result of the compare of the stored data in each of the plurality of memory sections (e.g., memory storage spaces 104) with the search input data (114) in the time division multiplexed fashion.

An example CAM (300, 400) may also include a state machine (302) configured to control when the comparator (304, 418, 418') compares the stored data (e.g., data stored in memory storage spaces 104) in each of the plurality of memory sections (e.g., memory storage spaces 104) with the search input data (114) based on a state of the state machine.

In an example, CAM (300, 400) the state machine (302) may include a counter (306). The state of the state machine (302) may correspond to a count of the counter (306). The comparator (304, 418, 418') compares the stored data in each of the plurality of memory sections (e.g., memory storage spaces 104) with the search input data (114) based on the count of the counter (306).

In an example, CAM (300, 400) the comparator (304, 418, 418') is further configured to compare the stored data (e.g., data stored in memory storage spaces 104) in each of the plurality of memory sections (memory storage spaces 104) with the search input data (114) in a time division multiplexed fashion.

In an example, CAM (300, 400) each of the plurality of memory access cycles (e.g., memory access cycles 0-3 of FIG. 3) access a subset of words in a set of memory locations (memory storage spaces 104) of the CAM (300, 400).

Another example CAM may include a plurality of memory sections (e.g., memory storage spaces 104). Each memory section (e.g., memory storage spaces 104) may be configured to store data. The CAM (300, 400) may also include a comparator (304, 418). The CAM (300, 400) may also include a state machine (302) configured to control when the comparator (304, 418, 418') compares the stored data (e.g., data stored in memory storage spaces 104) in each of the plurality of memory sections (e.g., memory storage spaces 104) with search input data (114) based on a state of the state machine (302).

In an example, the state machine (302) controls an encoder (408) to cause the encoder (408) to encode a result (e.g., match lines 412, 412') of a compare of the stored data (e.g., the data stored in memory storage spaces 104) in each of the plurality of memory sections (memory storage spaces 104) with the search input data (114).

In an example, the state machine (302) controls a register (422) to cause the register (422) to store at least one of the result (e.g., match lines 412, 412') of the compare of the stored data (e.g., the data stored in memory storage spaces 104) in each of the plurality of memory sections (e.g., memory storage spaces 104) with the search input data (114) in a time division multiplexed fashion.

In an example, the state machine (302) may include a counter (306). The state of the state machine may correspond to a count of the counter (306). Additionally, the comparator (304, 418, 418') may compare the stored data (e.g., the data stored in memory storage spaces 104) in each of the plurality of memory sections (e.g., memory storage spaces 104) with the search input data (114) based on the count of the counter (306).

In an example, the comparator (304, 418, 418') may be further configured to compare the stored data (e.g., the data stored in memory storage spaces 104) in each of the plurality of memory sections (e.g., memory storage spaces 104) with the search input data (114) in a time division multiplexed fashion.

In an example, the comparator (304, 418, 418') may be further configured to compare the stored data (e.g., the data stored in memory storage spaces 104) in each of the plurality of memory sections (e.g., memory storage spaces 104) with the search input data (114) in a corresponding one of a plurality of memory access cycles (memory access cycles 0-3 in FIG. 3).

In an example, each of the plurality of memory access cycles (memory access cycles 0-3 in FIG. 3) access a subset of words in a set of memory locations (e.g., memory storage spaces 104) of the CAM (300, 400).

In an example, a comparator may be configured to share compare circuitry among a plurality of memory sections.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." No claim element is to be construed under the provisions of 35 U.S.C. § 112(f) unless the element is expressly recited using the phrase "means for" or, in the case of a method claim, the element is recited using the phrase "step for."

What is claimed is:

1. A content addressable memory (CAM), comprising:
    a plurality of memory sections, each memory section comprising an addressable memory storage space configured to store data; and
    a comparator using shared compare circuitry configured to compare the stored data in each memory section of the plurality of memory sections with search input data by comparing data in each of the addressable memory storage spaces with the search input data in a time division multiplexed fashion, wherein the stored data in the addressable memory storage space of each memory section of the plurality of memory sections is multiplexed to the shared compare circuitry.

2. The CAM of claim 1, further comprising an encoder configured to encode a result of a comparison of the stored data in each memory section of the plurality of memory sections with the search input data.

3. The CAM of claim 2, further comprising a register configured to store the result of the comparison of the stored data in each memory section of the plurality of memory sections with the search input data in the time division multiplexed fashion.

4. The CAM of claim 1, further comprising a state machine configured to control when the comparator compares the stored data in each of the plurality of memory sections with the search input data based on a state of the state machine.

5. The CAM of claim 4, wherein the state machine comprises a counter, the state of the state machine corresponds to a count of the counter, and the comparator compares the stored data in each of the plurality of memory sections with the search input data based on the count of the counter.

6. The CAM of claim 1, wherein the comparator is further configured to compare the stored data in each memory section of the plurality of memory sections with the search input data in a corresponding memory access cycle of a plurality of memory access cycles.

7. The CAM of claim 6, wherein each memory access cycle of the plurality of memory access cycles accesses a subset of words in a set of memory locations of the CAM.

8. A content addressable memory (CAM), comprising:
    a plurality of memory sections, each memory section comprising an addressable memory storage space configured to store data; and
    a comparator using shared compare circuitry configured to compare the stored data in each memory section of the plurality of memory sections with search input data by comparing data in each of the addressable memory storage spaces with the search input data in a corresponding memory access cycle of a plurality of memory access cycles, wherein the stored data in the addressable memory storage space of each memory section of the plurality of memory sections is multiplexed to the shared compare circuitry.

9. The CAM of claim 8, further comprising an encoder configured to encode a result of a comparison of the stored data in each memory section of the plurality of memory sections with the search input data.

10. The CAM of claim 9, further comprising a register configured to store at least one of the result of the comparison of the stored data in each memory section of the plurality of memory sections with the search input data in a time division multiplexed fashion.

11. The CAM of claim 8, further comprising a state machine configured to control when the comparator compares the stored data in each memory section of the plurality of memory sections with the search input data based on a state of the state machine.

12. The CAM of claim 11, wherein the state machine comprises a counter, the state of the state machine corresponds to a count of the counter, and the comparator compares the stored data in each of the plurality of memory sections with the search input data based on the count of the counter.

13. The CAM of claim 8, wherein the comparator is further configured to compare the stored data in each of the plurality of memory sections with the search input data in a time division multiplexed fashion.

14. The CAM of claim 8, wherein each memory access cycle of the plurality of memory access cycles accesses a subset of words in a set of memory locations of the CAM.

15. A content addressable memory (CAM), comprising:
a plurality of memory sections each comprising an addressable memory storage space configured to store data;
a shared comparator; and
a state machine configured to control when the comparator compares the stored data in each of the plurality of memory sections with search input data by comparing data in each of the addressable memory storage spaces with the search input data based on a state of the state machine, wherein the stored data in the addressable memory storage space of each memory section of the plurality of memory sections is multiplexed to the shared comparator.

16. The CAM of claim 15, wherein the state machine in further configured to control an encoder to cause the encoder to encode a result of a compare of the stored data in each memory section of the plurality of memory sections with the search input data.

17. The CAM of claim 16, wherein the state machine is further configured to control a register to cause the register to store at least one of the result of the compare of the stored data in each memory section of the plurality of memory sections with the search input data in a time division multiplexed fashion.

18. The CAM of claim 15, wherein the state machine comprises a counter, the state of the state machine corresponds to a count of the counter, and the comparator compares the stored data in each of the plurality of memory sections with the search input data based on the count of the counter.

19. The CAM of claim 15, wherein the comparator is further configured to compare the stored data in each of the plurality of memory sections with the search input data in a time division multiplexed fashion.

20. The CAM of claim 15, wherein the comparator is further configured to compare the stored data in each memory section of the plurality of memory sections with the search input data in a corresponding memory access cycle of a plurality of memory access cycles.

21. The CAM of claim 20, wherein each memory access cycle of the plurality of memory access cycles accesses a subset of words in a set of memory locations of the CAM.

22. A method in a content addressable memory (CAM), the method comprising:
storing data in a plurality of memory sections comprising an addressable memory storage space in the CAM; and
comparing the stored data using shared compare circuitry in each of the plurality of memory sections with search input data by comparing data in each of the addressable memory storage spaces with the search input data in a time division multiplexed fashion, wherein the stored data in the addressable memory storage space of each memory section of the plurality of memory sections is multiplexed to the shared compare circuitry.

23. The method of claim 22, further comprising encoding a result of a compare of the stored data in each of the plurality of memory sections with the search input data.

24. The method of claim 23, further comprising storing the results of the compare of the stored data in each of the plurality of memory sections with the search input data in the time division multiplexed fashion.

* * * * *